United States Patent [19]

Petersen

[11] 4,280,586

[45] Jul. 28, 1981

[54] SPEAKER ENCLOSURE

[76] Inventor: Ted W. Petersen, 2565 Offutt Rd., Woodstock, Md. 21163

[21] Appl. No.: 117,423

[22] Filed: Feb. 1, 1980

Related U.S. Application Data

[63] Continuation of Ser. No. 904,280, May 9, 1978, abandoned.

[51] Int. Cl.3 .............................................. H05K 5/00

[52] U.S. Cl. .................................... 181/150; 181/199

[58] Field of Search ............... 181/199, 147, 148, 150, 181/152, 156, 159, 155

[56] References Cited

U.S. PATENT DOCUMENTS

| | | | |
|---|---|---|---|
| 1,887,185 | 11/1932 | Quinby | 181/150 |
| 2,206,012 | 7/1940 | Hart | 181/152 |
| 3,642,091 | 2/1972 | Nohara et al. | 181/152 |
| 3,912,866 | 10/1975 | Fox | 181/155 |
| 3,941,207 | 3/1976 | Croup | 181/199 |
| 3,982,607 | 9/1976 | Evans | 181/152 |
| 4,006,308 | 2/1977 | Pönsgen | 181/147 |
| 4,122,910 | 10/1978 | Wehner | 181/199 |
| 4,142,604 | 3/1979 | Smith | 181/199 |

*Primary Examiner*—L. T. Hix
*Assistant Examiner*—Benjamin R. Fuller
*Attorney, Agent, or Firm*—Walter G. Finch

[57] ABSTRACT

The invention is an improved enclosure for electronic speakers used in sound reproduction equipment. The enclosure is in the form of a pyramid with the speaker mounted at a precise position within the enclosure to give improved results in sound reproduction. The invention includes associated mountings for support equipment within the enclosure and in relation to the enclosure.

3 Claims, 11 Drawing Figures

SPEAKER ENCLOSURE

This is a continuation of U.S. application Ser. No. 904,280, filed May 9, 1978 now abandoned by the applicant.

BACKGROUND AND SUMMARY OF THE INVENTION

The invention relates to enclosures for speaker devices used in electronic sound reproduction and in particular to enclosures in the form of a pyramid. Specifically, it relates to such enclosures with the speaker equipment mounted at a precise position within the enclosure to give improved results in sound reproduction.

A need has existed for a long time for an improvement in the reproduction of sound, particularly at the point of the speaker itself in the sound reproducing equipment. The present invention provides such improvements.

In the old art the cabinets were merely boxes in which the speakers were mounted, or a conical megaphone effect was added to project the sound.

The invention provides not only the configuration of the enclosure, but the precise location of the speaker within the enclosure. In addition, the invention also provides for accomodating the associated speaker equipment.

The invention takes advantage of the mystique that has surrounded pyramids for some time, however, the problem was determining how and where to place the speaker within a pyramidal enclosure. This invention solves that problem.

It is, therefore, an object of the invention to provide an enclosure for the speaker electronic sound reproduction systems.

It is also an object of the invention to provide a speaker enclosure that is in the form of a pyramid.

It is another object of the invention to provide an enclosure for the speaker of an electronic sound reproduction system in which the speaker is precisely located within the speaker enclosure.

It is yet another object of the invention to provide for accomodating other associated speaker equipment within the enclosure.

It is still another object of the invention to provide a speaker enclosure that produces an improved sound quality.

Further objects and advantages of the invention will become more apparent in light of the following description of the preferred embodiments.

DESCRIPTION OF THE PREFERRED EMBODIMENTS

Figure 1:
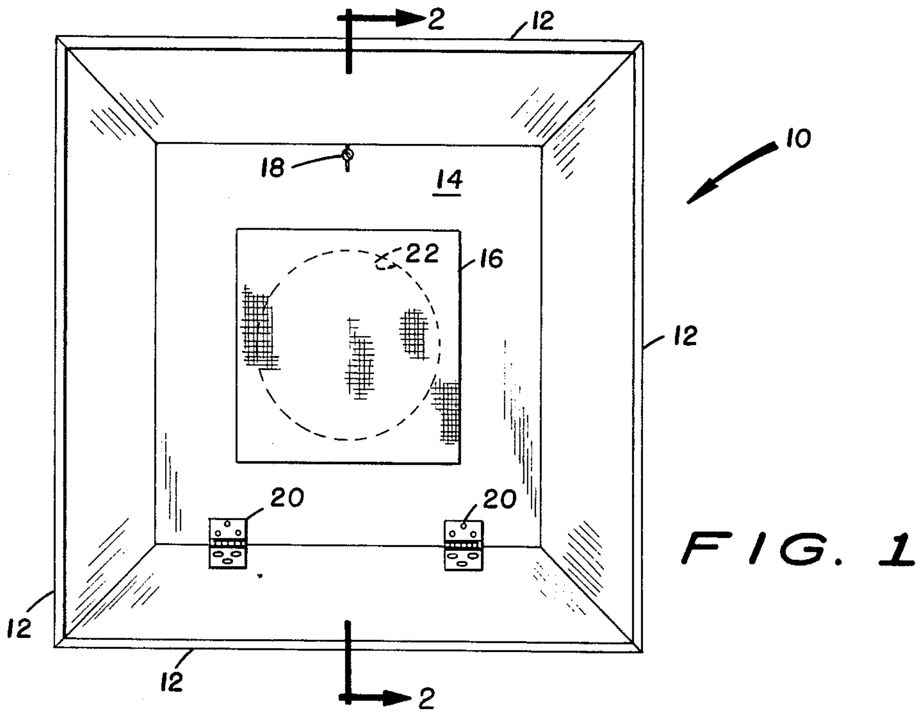
FIG. 1 is a plan view of the speaker enclosure from the open side where the sound is emitted.
Figure 3:
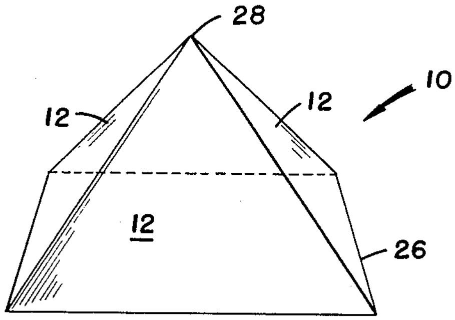
FIG. 3 is a perspective view of the exterior of the pyramidal speaker enclosure.
Figure 2:
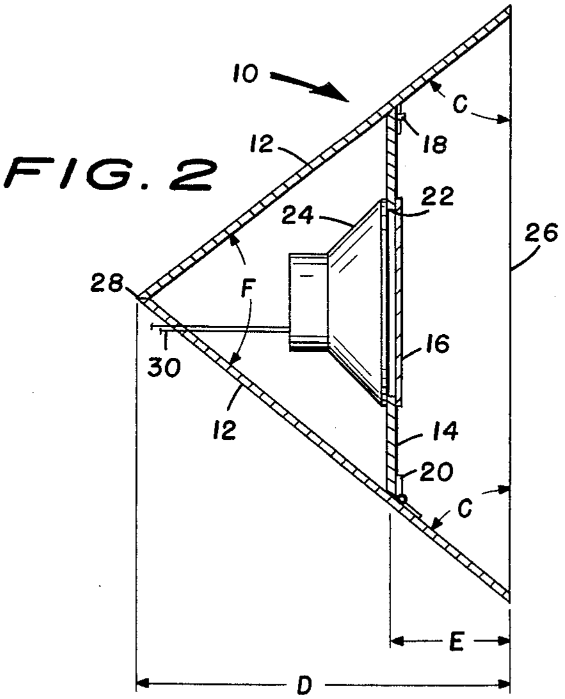
FIG. 2 is a cross section view taken on line 2—2 of FIG. 1, showing a first embodiment of the mounting of the speaker within enclosure.

Referring now to the drawings and particularly to FIGS. 1, 2, and 3, the speaker enclosure can be seen at 10 in FIGS. 1, 2, and 3.

The exterior of the speaker enclosure 10 can be seen in FIG. 3 as a perspective view. The sides or faces 12 of the pyramidal speaker enclosure 10 are shown clearly in FIG. 3, each leaning inwardly from the base 26 of each face 12 to a common apex 28 to form a hollow shell.

Figure 4:
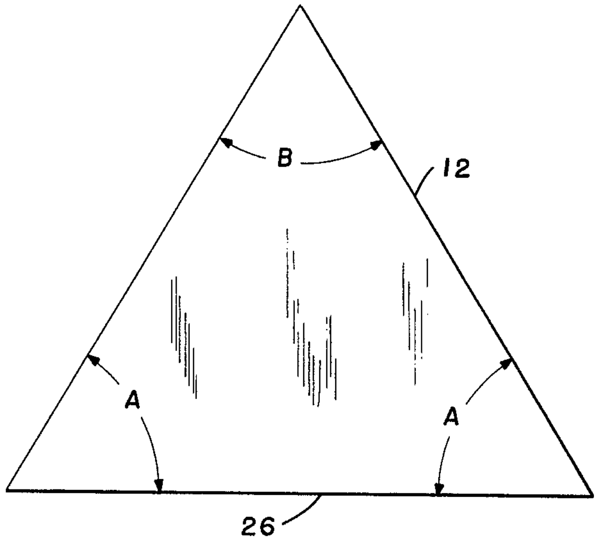
FIG. 4 is a plan view of one face of the pyramidal speaker enclosure.

Each face 12 is an isosceles triangle as shown in FIG. 4 where one face 12 is shown as a plan view of the face 12. Being an isosceles triangle, angles A at the base are equal and when each is 60°, then angle B at the apex is also 60°. Likewise, each side of the isosceles triangle is equal to each other, in other words equal to the length of the base 26, when the angles are 60°. However, the angle A need not be 60°. For illustration of other aspects of this invention and ease of understanding the angles will be taken as 60° and ease of understanding the angles will be taken as 60° for illustrative purposes only.

When the four faces 12 are formed into the pyramidal speaker enclosure 10 as hereinbefore described, in four faces 12 form a square at the base of the pyramid thus formed (the base 26 of each face 12 being equal).

In a section taken through the center of the pyramidal speaker enclosure 10, as is shown in FIG. 2, the two interior angles C are less than 60° as formed by the interior surface of each face 12 with the horizontal projection of base 26. Note that the length of the base of the triangle seen in FIG. 2 is still equal to the length of base 26 of one of the faces 12, whereas the length of each of the sides of the triangle, seen in FIG. 2 in section, are less than the length of the base 26. The length of each of the sides of the triangle seen in FIG. 2 is actually the same as the surface height of the triangular face 12. This, then, makes the angles C equal but less than 60°.

As the two angles C are equal to each other but less than 60° it follows that angle F is then larger than 60°.

In FIG. 2 one embodiment can be seen of the speaker 24 mounted inside of speaker enclosure 10. The speaker mounting or mounting panel 14, with the speaker 24 affixed to it over the opening 22 on one side and a screenlike speaker covering 16 for the opening 22 affixed to the other side of speaker mounting 14, is located at a point or distance E from the horizontal projection of base 26. This distance E is one-third the vertical height of the pyramid height D. It is to be noted that this distance E is one-third of the vertical height of the pyramid 10 and not one-third of the surface height of one of the triangular faces 12.

The speaker mounting 14 may be permanently secured in place or secured in a manner requiring tools to attend the speaker unit 24. However, the preferred method of securing the speaker mounting 14 in place is to provide the speaker mounting 14 with a pair of hinges 20 on one side and a latch 18 on the opposite side for easy access. The hinges 20 and latch 18 may be seen in FIG. 1 as well.

In this first embodiment, shown in FIG. 2, the back-wave from the upper area reinforces the full-range speaker's cone. The lower side areas of the faces 12 below the speaker mounting 14 helps direct and amplify the output wave.

The speaker in-put wires 30 are passed through an opening in one of the faces 12 for connection to the equipment which is to reproduce sound.

In FIGS. 5 through 10 are shown other typical mountings for the speaker 24 in the speaker enclosure 10. In FIG. 11 the mounting of a special speaker 60 is shown in the speaker enclosure 10, which will be described later.

Figure 5:
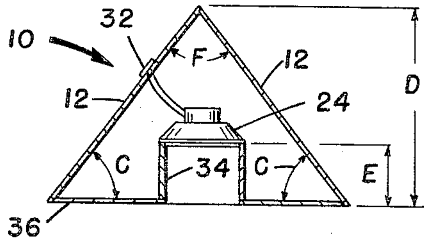
FIG. 5 is a cross section view of the speaker enclosure showing a second embodiment of the mounting of the speaker within the enclosure.

In FIG. 5, the speaker 24 is placed at the aforementioned one-third distance by mounting it on a cylindrical holder or spacer 34 that sets the speaker 12 at the height E for the one-third distance. The cylindrical holder 34 is affixed to a panel 36 across the base of the pyramidal enclosure 10. A terminal strip 32 is shown as one method of connecting to the speaker in-put wires.

Figure 6:
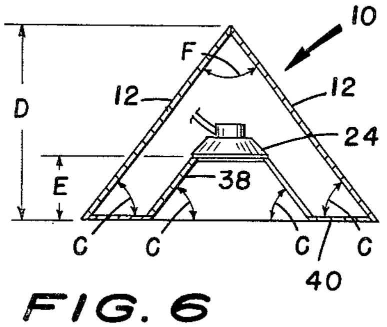
FIG. 6 is a cross section view of the speaker enclosure showing a third embodiment of the mounting of the speaker within the enclosure.

In FIG. 6, the speaker 24 is placed on a conical holder 38 in a manner similar to that shown in FIG. 5. The conical holder or spacer 38 is affixed to panel 40 across the base of the pyramidal enclosure 10. The same effect of the back-wave is obtained.

Figure 7:
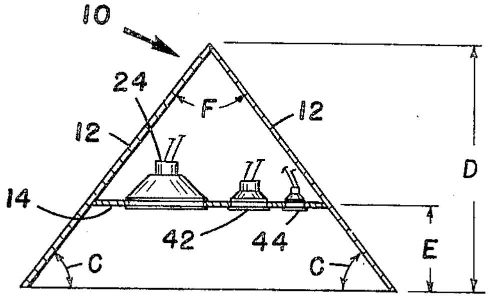
FIG. 7 is a cross section view of the speaker enclosure showing a fourth embodiment of the mounting of the speaker and also additional equipment within the enclosure.

In FIG. 7 an arrangement is shown that is similar to FIG. 2, except that additional speakers 42 and 44 are shown mounted within the speaker enclosure 10 on the speaker mounting 14. A mid-range speaker 42 and a tweeter speaker 44 have been added. However, these two speakers 42 and 44 normally have closed backs and do not depend on a back-wave to assist them. If open-back mid-range and tweeter speakers 42 and 44, respectively, are used the one-third distance would apply, but normally back-wave may cause distortion of the upper frequencies.

Figure 8:
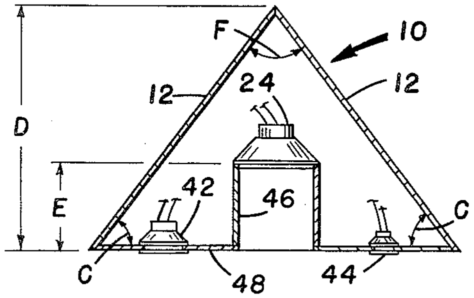
FIG. 8 is a cross section view of the speaker enclosure showing a fifth embodiment of the mounting of the speaker and also additional equipment within the enclosure.

A variation of the arrangement in FIG. 7 is shown in FIG. 8 where the speaker 24 is mounted on a cylinder or spacer 46 set on a panel 48, similar to that shown in FIG. 5, and the mid-range speaker 42 and the tweeter speaker 44 are set in the panel 48 at the base of the pyramidal enclosure 10.

Figure 9:
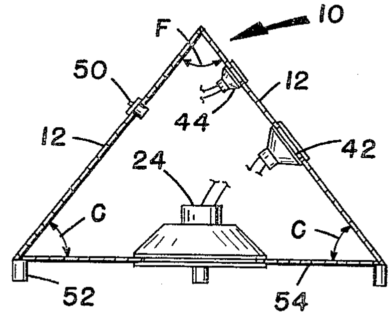
FIG. 9 is a cross section view of the speaker enclosure showing a sixth embodiment of the mounting of the speaker and also additional equipment within the enclosure.

In FIG. 9 a variation is shown that sets the woofer speaker 24 in a panel 54 at the base of the speaker enclosure 10 and adds legs 52 to the base of the pyramidal speaker enclosure 10. In this arrangement the woofer speaker 24 is aimed downwardly toward the floor and the lower notes are bounced off of the floor and forced out between the legs 52. The mid-range speaker 42 and the tweeter speaker 44 are mounted in one or more of the triangular faces 12 of the speaker enclosure 10. An access or turning port 50 is provided for access to the interior of the speaker enclosure 10.

Figure 10:
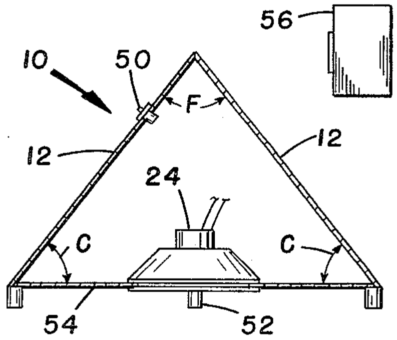
FIG. 10 is a cross section view of the speaker enclosure showing a seventh embodiment of the mounting of the speaker and also related equipment.
Figure 11:
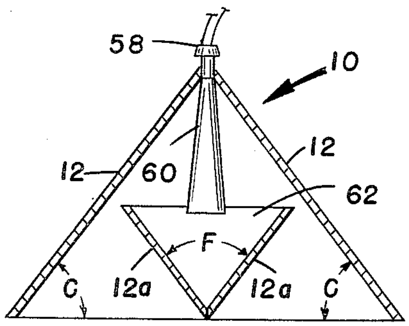
FIG. 11 is a cross section view of the speaker enclosure showing an eighth embodiment of the mounting of a speaker within the enclosure.

A variation of FIG. 9 is shown in FIG. 10, in which a separate speaker enclosure 56 is affixed to the wall at a suitable location. The mid-range speaker 42 and the tweeter 44 are mounted in the separate speaker enclosure 56.

A special variation is shown in FIG. 11 where sound output intensity is required, such as in public address or other communications applications where high fidelity is not essential. The arrangement in FIG. 11 is somewhat like a horn. The arrangement gives a triple amplification. The sound produced by the driver 58 is amplified by the first amplifying cone 60 and then secondly by the amplifying cone 12a. Note that the amplifying cone 12a has the same included angle between the sides as that at the apex of the other Figures. The amplifying cone 12a is mounted within the main speaker enclosure 10 by suitable means.

All of the arrangements described hereinbefore may be located within the room in any manner, note that FIGS. 9 and 10 also provide for mounting the speaker enclosure 10 near to and facing the floor. The mountings may be made by placing the speaker enclosure 10 on a stand, hanging from a ceiling chain, wall mounted, etc. The important factor being the improved output provided by the pyramidal configuration.

As can be readily understood from the foregoing description of the invention; the present structure can be configured in different modes to mount a speaker within it to obtain the results because of the pyramidal configuration.

Accordingly, modifications and variations to which the invention is susceptible may be practiced without departing from the scope and intent of the appended claims.

What is claimed is:

1. In a sound system, a speaker enclosure comprising:

a hollow pyramidal shell, said hollow pyramidal shell being formed by four face members, each said face member being triangular in configuration, each said face member having equal length bases, and each having equal length sides, said face members being so arranged so that the base of said pyramidal shell is a square and the apex of each said triangular face member meet at the common apex of said hollow pyramidal shell; and a mounting panel, said mounting panel being within said hollow pyramidal shell, at least one speaker affixed on said mounting panel, said mounting panel being suitably connected to the interior faces of said hollow pyramidal shell, said hollow pyramidal shell and said mounting panel enclosing said speaker, said mounting panel being affixed within said hollow pyramidal shell at a distance from the base of said hollow pyramidal shell equal to one-third the vertical height of said hollow pyramidal shell.

2. The speaker enclosure as recited in claim 1, and additionally hinge means for connecting said mounting panel to the interior surface of one of said face members of said hollow pyramidal shell, and latch means at the interior surface of the face member of said hollow pyramidal shell which is opposite to said hinged means, said hinge means and said latch means being for purpose of positioning said mounting panel, said mounting panel having an aperture therein over which said speaker is affixed on the side of said mounting panel toward the apex of said hollow pyramidal shell.

3. The speaker enclosure as recited in claim 2 and additionally, a screen-like cover means over said aperture, said screen-like cover means being affixed to exterior side of said mounting panels.

* * * * *